United States Patent
Edwards et al.

(10) Patent No.: US 7,707,438 B1
(45) Date of Patent: *Apr. 27, 2010

(54) INTEGRATED CIRCUIT HAVING AFTER MARKET MODIFIABLE PERFORMANCE

(75) Inventors: William T. Edwards, Austin, TX (US); Daryl G. Sartain, Cedar Park, TX (US)

(73) Assignee: GlobalFoundries Inc., Grand Cayman (KY)

(*) Notice: Subject to any disclaimer, the term of this patent is extended or adjusted under 35 U.S.C. 154(b) by 752 days.

This patent is subject to a terminal disclaimer.

(21) Appl. No.: 11/478,901

(22) Filed: Jun. 30, 2006

(51) Int. Cl.
  *G06F 1/26* (2006.01)
(52) U.S. Cl. .................... 713/300; 713/100
(58) Field of Classification Search ........... 713/100, 713/300
  See application file for complete search history.

(56) References Cited

U.S. PATENT DOCUMENTS

| | | | |
|---|---|---|---|
| 5,740,404 A | 4/1998 | Baji | 395/494 |
| 6,047,373 A | 4/2000 | Hall et al. | 713/1 |
| 6,256,731 B1 | 7/2001 | Hall et al. | 713/1 |
| 6,694,492 B1 * | 2/2004 | Shakkarwar | 716/2 |
| 7,020,854 B2 | 3/2006 | Killian et al. | 716/1 |
| 7,215,590 B1 * | 5/2007 | Borden et al. | 365/226 |
| 7,324,450 B2 * | 1/2008 | Oliver | 370/235 |
| 7,370,189 B2 * | 5/2008 | Fischer et al. | 713/2 |

* cited by examiner

*Primary Examiner*—Albert Wang
(74) *Attorney, Agent, or Firm*—Hamilton & Terrile, LLP; Stephen A. Terrile

(57) ABSTRACT

A configurable performance module for use in an integrated circuit. The configurable performance module includes a performance control circuit which controls a performance level of the integrated circuit to enable changing the performance level of the integrated circuit from a first performance level to a second performance level after manufacturing of the integrated circuit is complete.

12 Claims, 6 Drawing Sheets

INTEGRATED CIRCUIT HAVING AFTER MARKET MODIFIABLE PERFORMANCE

BACKGROUND OF THE INVENTION

1. Field of the Invention

The present application relates to integrated circuits, and more particularly to integrated circuits having market modifiable performance.

2. Description of the Related Art

Performance of integrated circuits continues to improve along with semiconductor manufacturing yield rates. The pricing of integrated circuits is generally based on market demand as well as the speed or performance ratings of the integrated circuit. Additionally, the anticipated production yield affects pricing as well as customer commitments. For example, FIG. 1a, labeled Prior Art, shows is a generalized illustration of a distribution of market demand of processors corresponding to certain processor clock speed. In this illustration, a majority of the processors produced demonstrate clock speeds that are +/−5% of the predicted speed, with fewer processors demonstrating clock speeds that are +/−10% of predicted speed, and fewer yet that demonstrate clock speeds that are +/−15% of predicted speed. Processors that demonstrate +/−5% clocks speed variance are typically labeled at the nominal rated speed. This nominal speed is priced accordingly and often a processor manufacturer will make quantity commitments to supply a certain number of processors at this performance level for a predefined price. Processors demonstrating clock speeds that are 10-15% higher than predicted speeds are sorted or graded (e.g., binned) according to their rating and labeled appropriately. These higher performing processors are typically sold at a higher price point. Additionally, as with the nominal speed processors, a processor manufacturer will make quantity commitments to supply a certain number of processors at this performance level for another predefined price. Similarly, those processors that demonstrating clock speeds that are 10-15% lower than predicted speeds are likewise binned according to their lower rating and typically sold at a lower cost, or possibly, judged to not be marketable and discarded.

FIG. 1b, labeled Prior Art, is a generalized illustration of an example actual yield rate as compared to market demand commitments as well as an example of how the processors might be sorted according to predefined customer commitments. In this illustration, the actual production yield was better in both quantity and performance when compared to market demand. However, because customer commitments were made for certain quantities at certain performance levels, some of the processors that yielded at a higher performance level might be "downgraded" such that the higher performance processors are sorted and binned at a lower performance level.

When the processors are binned, one of the final steps of the processor fabrication process is locking the processor to a particular performance level. This locking is typically performed by blowing fuses within the processor so that the processor is then configured to perform a certain number of operations within a predefined time period.

While certain segments of the market have requirements for higher performing products and are willing to pay for them, other segments may not have a current need but might in the future, especially if their requirements change. For example, a computer system may be placed in service for general business use and might not need the fastest processor. At a later time, the same computer system may be repurposed for use for editing digital content, which typically requires a higher performing system. As another example, a newer version of an operating system may require a faster processor to deliver the same level of performance as the current processor with the earlier version of the operating system. Currently, these situations might require the purchase of a new computer system or upgrading the processor to a higher performing version. New computer systems can be costly and the replaced computer system is often reassigned or retired from service. If the processor is upgraded the cost of a new processor is incurred along with the time and effort required for the upgrade.

Predicting when additional performance will be required is difficult and can result in unnecessary cost. For example, business customers are often compelled to purchase the performance they might need in the future at a premium today, whether it is eventually needed or not.

In view of the foregoing, there is a need for delivering processors and other integrated circuits that have dormant performance that can activated and paid for on an as-needed basis.

SUMMARY OF THE INVENTION

The present invention provides a method and system to remotely configure performance in a processor or other integrated circuit device in return for commensurate consideration.

For example, a general purpose computer can be purchased with a processor that is capable of operating at a speed of 3 GHz, yet initially operates at a clock speed of 2 GHz. At a later date, additional performance can be purchased to remotely and non-intrusively unlock the processor's dormant performance capabilities to deliver a clock speed of 2.5 Ghz. The metrics for the purchase of the unlocked performance are predetermined by the manufacturer or supplier intermediary, and can be a one-time for perpetual use of the higher performance thereafter, for a limited period of time (e.g., 90 days), or for limited peak usage not to exceed a predetermined percentage of overall non-idle cycles.

In one embodiment, the invention relates to a configurable performance module for use in an integrated circuit which includes a performance control circuit. The performance control circuit controls a performance level of the integrated circuit and enables changing the performance level of the integrated circuit from a first performance level to a second performance level after manufacturing of the integrated circuit is complete.

In another embodiment, the invention relates to a processor which includes a processor core and a configurable performance module coupled to the processor core. The configurable performance module includes a performance control circuit which controls a performance level of the integrated circuit and enables changing the performance level of the integrated circuit from a first performance level to a second performance level after manufacturing of the integrated circuit is complete.

DETAILED DESCRIPTION

Figure 1A:
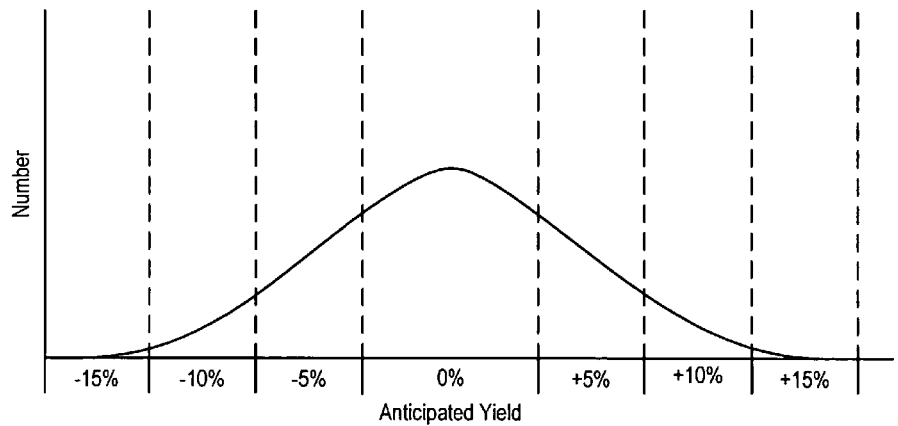
FIGS. 1a and 1b, generally referred to as FIG. 1 and labeled Prior Art, show distributions and yield rates of integrated circuits.
Figure 1B:
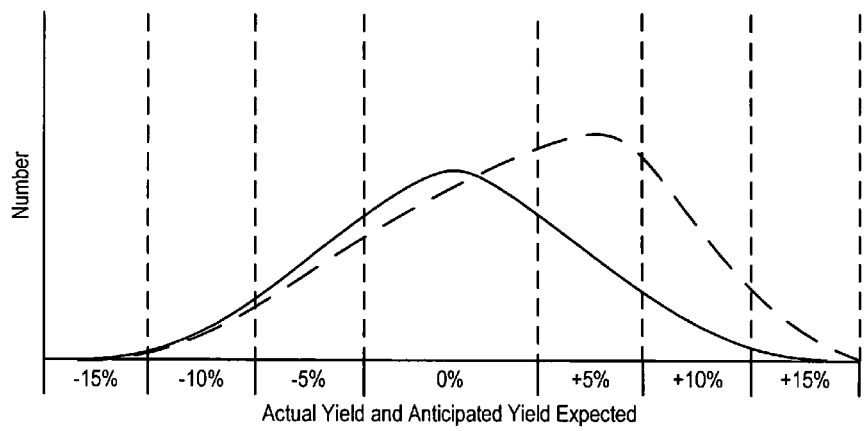
Figure 2:
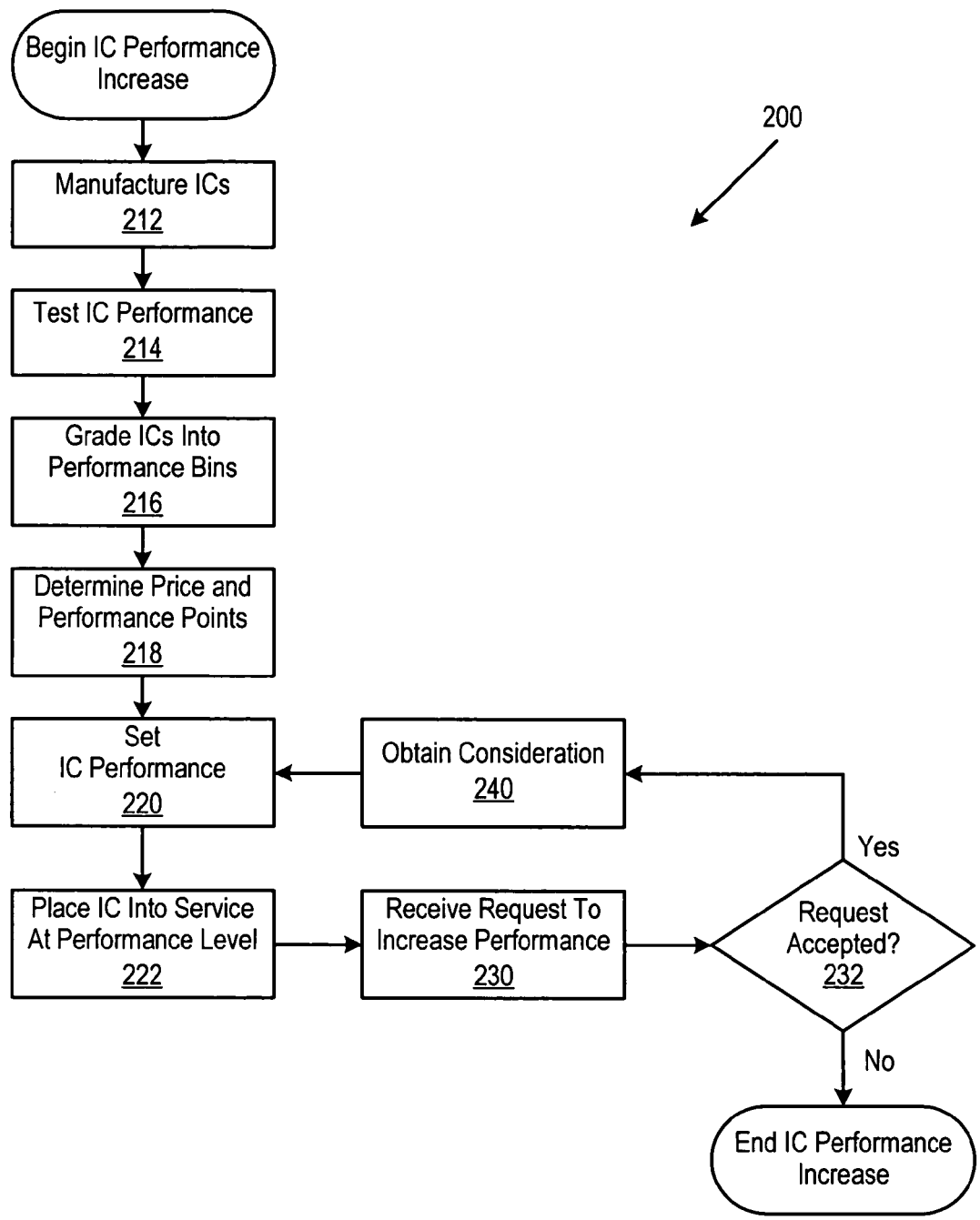
FIG. 2 shows a flow chart of the operation of a system for enabling and configuring integrated circuit performance.

Referring to FIG. 2, a generalized flow chart of the operation of a system for enabling increased performance and remotely increasing performance in an integrated circuit is shown. When the system starts operation, integrated circuits (ICs) are manufactured at Step 212 and their performance is tested at Step 214. Based on their tested performance characteristics, ICs are then binned at Step 216 with their corresponding price points being determined at Step 218. Initial processor performance levels are set at Step 220 and the IC is placed into service at Step 222.

Once placed into service, a request for additional performance is received at Step 230. If the request is accepted at Step 232, then consideration is obtained in Step 240 and the new level of performance is set at Step 220.

If the request is denied at Step 232, then the operation of the system for enabling increased performance and remotely increasing performance completes.

Figure 3:
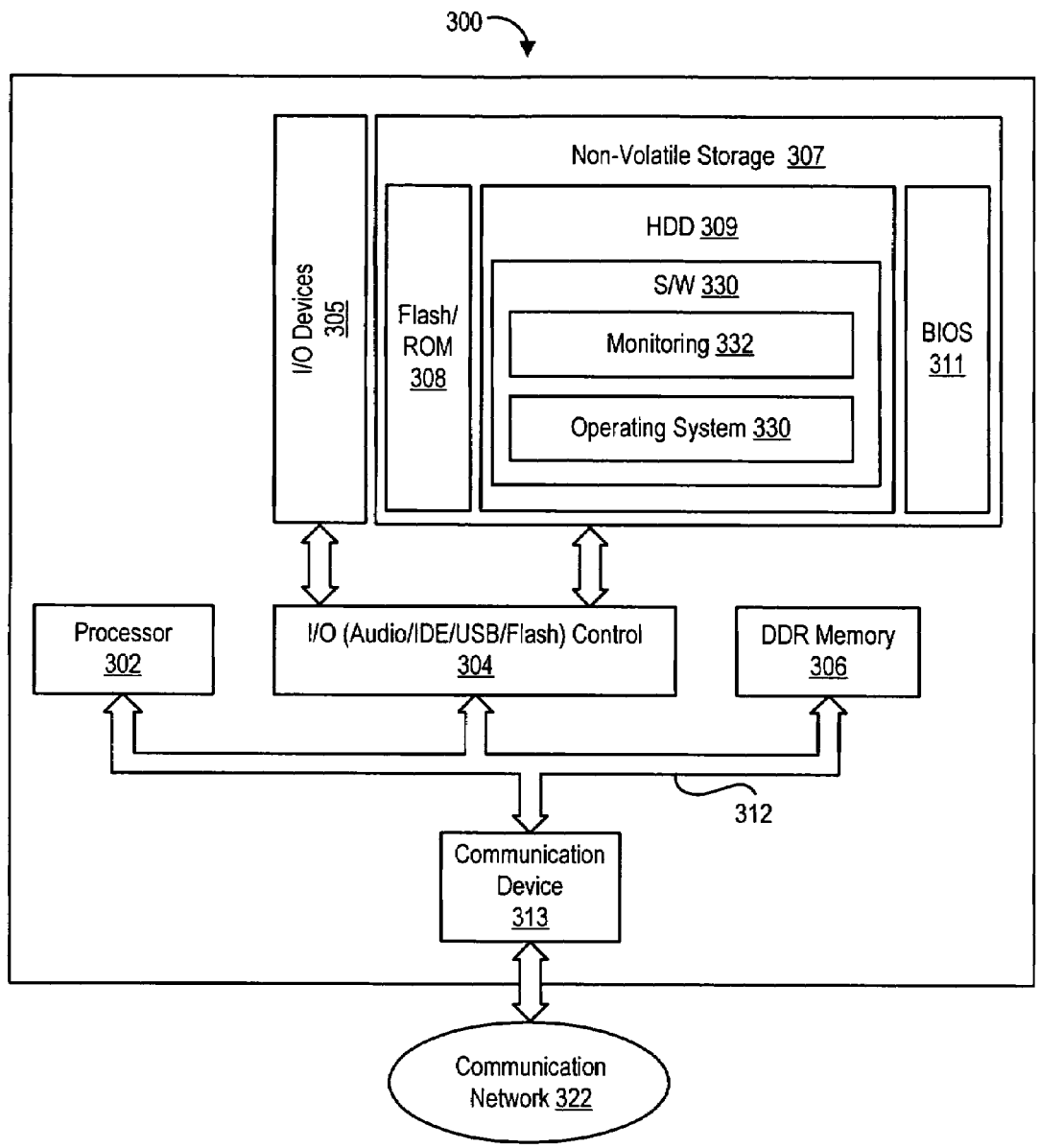
FIG. 3 shows a block diagram of a computer system having an integrated circuit performance monitor module.

Referring to FIG. 3, a block diagram of an exemplary computer system 300 is shown. The computer system 300 includes a processor 302, input/output (I/O) control device 304, memory (including volatile random access memory (RAM) memory 306 and non-volatile memory 307), communication device 313 (such as a modem) and a display 314. The processor 302, I/O controller 304, memory 306 and communication device 313 are interconnected via one or more buses 312. The non-volatile memory 307 may include a hard disk drive 309 either or both of the memories 306, 307 may be integrated with or external to the computer system 300. Of course, it will be appreciated that other device configurations may also be used for the processor 302, memory 306, 307, display 314 and communication device 313. For clarity and ease of understanding, not all of the elements making up the computer system 300 are described in detail. Such details are well known to those of ordinary skill in the art, and may vary based on the particular computer vendor and microprocessor type. Moreover, the computer system 300 may include other buses, devices, and/or subsystems, depending on the implementation desired. For example, the computer system 300 may include caches, modems, parallel or serial interfaces, SCSI interfaces, network interface cards, and the like.

The I/O control device 304 is coupled to I/O devices 305, such as one or more USB ports, a keyboard, a mouse, audio speakers, etc. The I/O control device 304 is also coupled to non-volatile storage 307, such as a flash memory or other read only memory (ROM) 308 and/or hard disk drive 309. The computer system 300 may be connected to a communication network 322, such as the Internet, by the communication device 313, such as a modem, but the connection may be established by any desired network communication device known to those of skill in the art. Though the processor 302 is shown as being coupled directly to a display device 314, the processor may also be coupled indirectly to the display 314 through a display or I/O controller device. Similarly, the processor is shown as being coupled through the I/O controller 304 to the non-volatile memory 307, though direct coupling is also contemplated.

Various programming codes and software are stored in the memory. For example, the basic input/output system (BIOS) code 311 that starts the computer system 300 at startup may be stored in a BIOS ROM device of the non-volatile storage 307, such as a ROM (Read Only Memory) or a PROM (Programmable ROM) such as an EPROM (Erasable PROM), an EEPROM (Electrically Erasable PROM), a flash RAM (Random Access Memory) or any other type of memory appropriate for storing BIOS. The BIOS 311 is essentially invisible to the user and boots to the operating system.

Software 330 includes an operating system 330 and a performance monitoring module 332.

Figure 4:
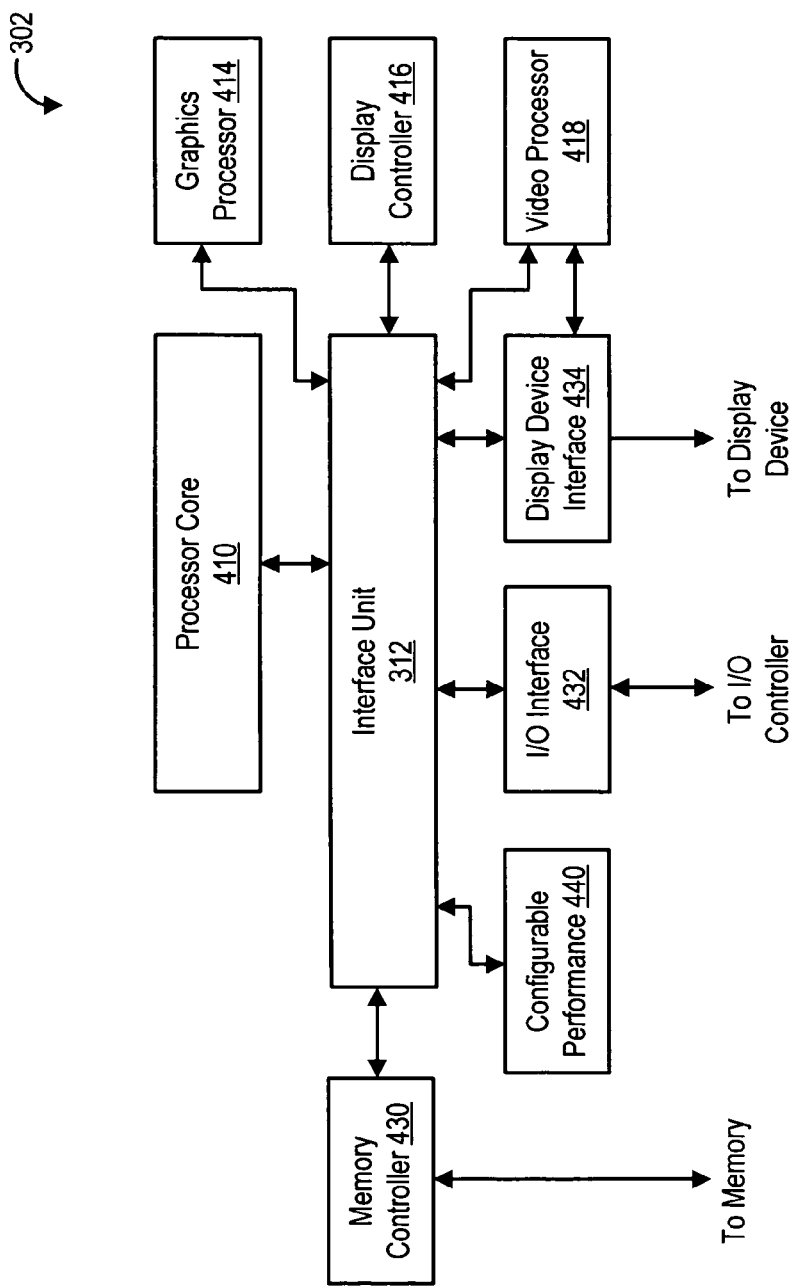
FIG. 4 shows a block diagram of a processor having a configurable performance module.

Referring to FIG. 4, a block diagram of the processor 302 is shown. In one embodiment, the processor 302 is a processor available from Advanced Micro Devices. The processor 302 includes a processor core 410, a bus or interface unit 412, a graphics processor 414, a display controller 416, and a video processor 418. The processor 202 also includes a memory controller 430, an I/O controller interface 432, a display device interface 434 and a configurable performance module 440, though it will be appreciated that these controllers and interfaces may be implemented externally to the processor 302. The processor 302 executes software stored in the memory 206, 207.

The configurable performance module 440 enables the processor 302 to have an initial performance level set during the fabrication of the processor 302, but then to have the performance level of the processor be reconfigurable after point of sale of the processor 302.

Figure 5:
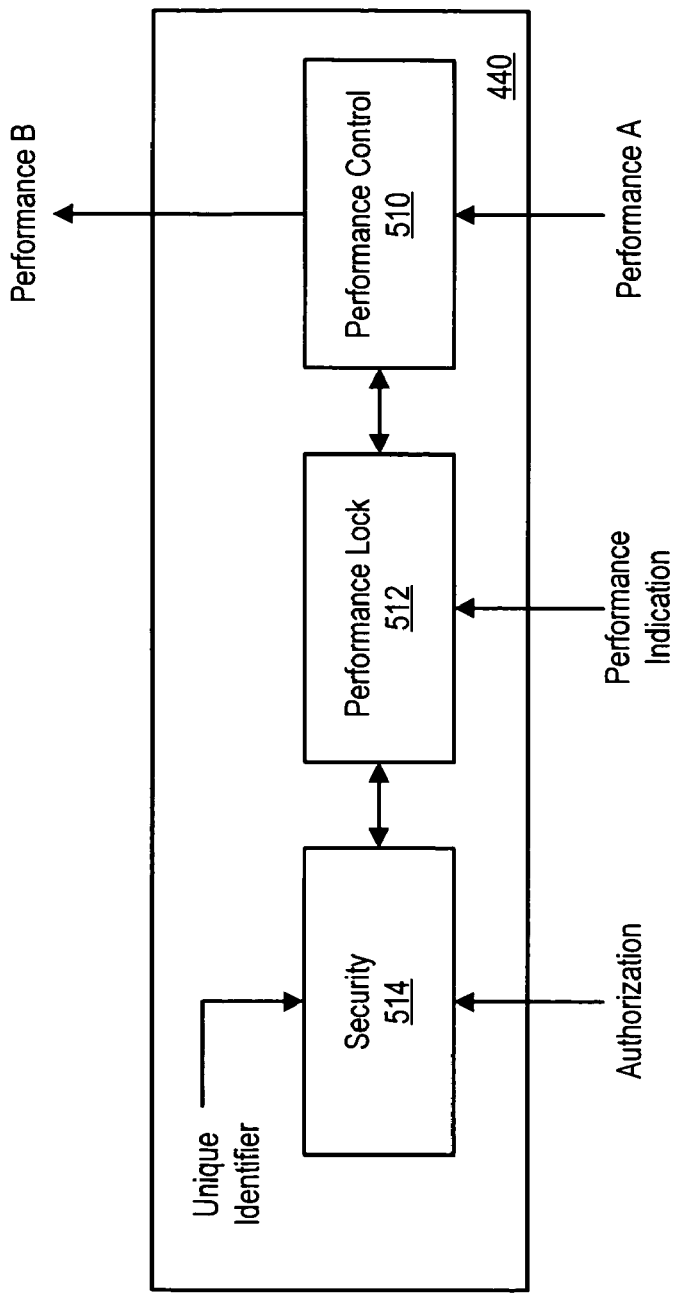
FIG. 5 shows a block diagram of the configurable performance module.

FIG. 5 shows a block diagram of the configurable performance module 440. More specifically, the configurable performance module 440 includes a performance control circuit 510 a performance lock circuit 512 and a security circuit 514. The performance control circuit 510 is coupled to the performance lock circuit 512. The performance control circuit 510 receives a first clock signal (clock A) and provides a second clock signal (clock B). The performance lock circuit 512 is coupled to the security circuit 514 and the performance control circuit 512. The performance lock circuit 512 receives a performance indication. The security circuit 514 receives an authorization signal. The security circuit 514 is coupled to an integrated circuit unique identifier as well as the performance lock circuit 512.

The performance lock circuit 512 causes the performance control circuit 510 to function at a certain predefined performance level until and unless certain conditions are met to enable the performance of the processor 510 to be changed (e.g., increased). The security circuit 514 ensures that any change in performance indication is appropriately authorized. For example, for performance of the processor to be increased, a predefined performance indication is received along with a predefined authorization. The performance lock circuit 512 may be further configured such that the performance indication and the authorization must be received within a predefined time window. Also for example, the authorization might be encrypted such that some form of unique identifier is used to decrypt the authorization. This unique identifier might be a serial number or some form of lot identifier such that this information is not readily discoverable, but also does not disclose or provide any customer confidential information.

Figure 6:
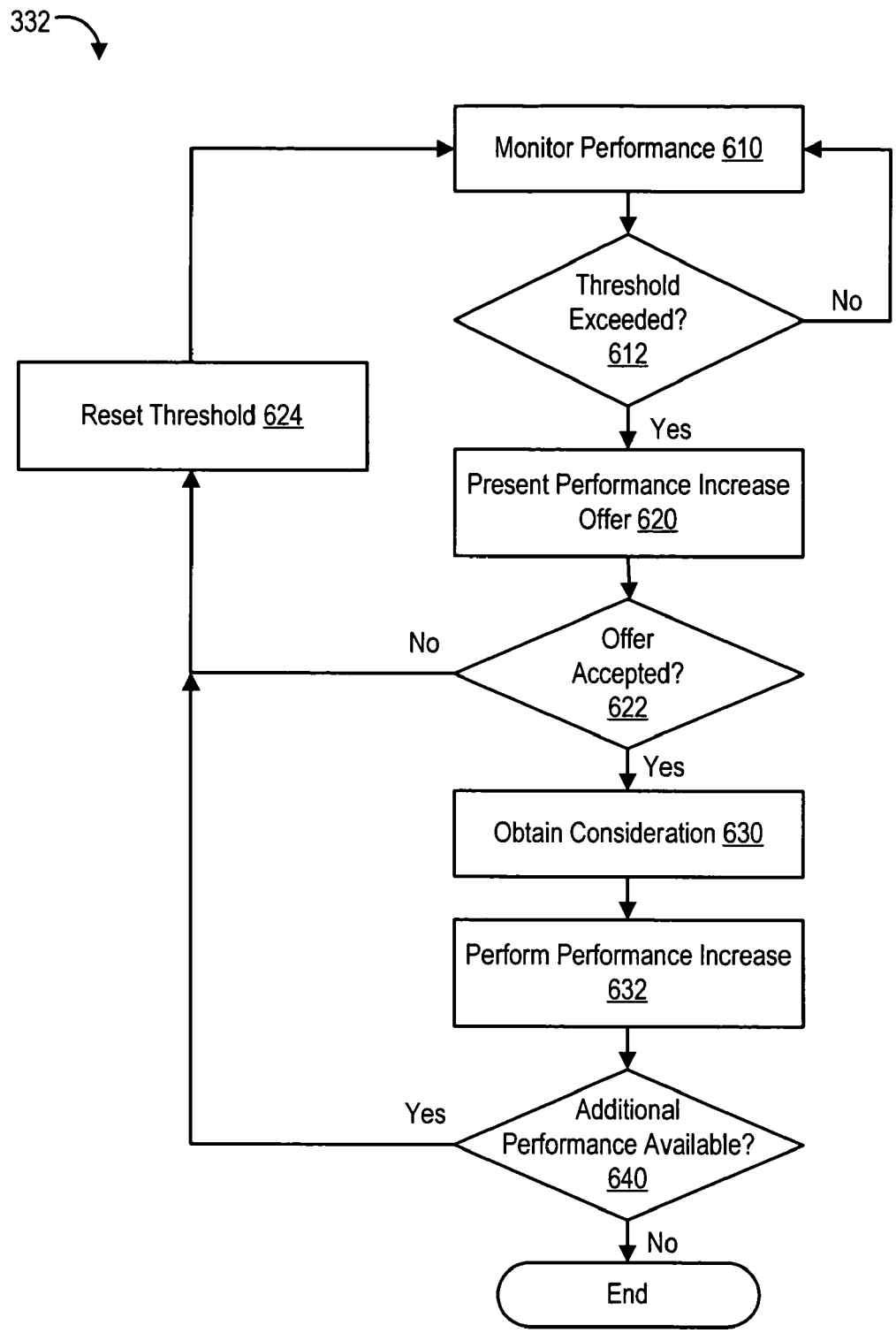
FIG. 6 shows a block diagram of the operation of the integrated circuit performance monitor module.

FIG. 6 shows a block diagram of the operation of the integrated circuit performance monitor module 332. More specifically, the integrated circuit performance monitor module 332 starts operation by monitoring the performance of the integrated circuit to which it is assigned at step 610. The integrated circuit performance monitor module 332 determines whether a performance threshold has been exceeded at step 612. The performance threshold may be a one time exception (e.g., a certain percentage of performance availability is exceeded), an ongoing exception (e.g., a certain percentage of performance availability is exceeded for a certain amount of time or is exceeded a certain percentage of time) or some combination of a one time type exception and ongoing exception.

If no threshold has been exceeded, then the integrated circuit performance monitor module 332 continues to monitor performance at step 610.

If a performance threshold is exceeded then the integrated circuit performance monitor module 332 presents a performance increase offer to the user of the computer system at step 620. The performance increase offer may be a one time increase offer (e.g., by the customer paying a certain amount, the increased performance is unlocked), may be an ongoing increase offer (e.g., the customer may pay an ongoing regular amount to have the performance unlocked while the customer is paying, e.g. a lease for the increased performance), the performance increase offer may be a selective increase offer for the times when the increased performance is needed (e.g., the performance control circuit 512 is unlocked in such a way that when the customer needs increase performance, that performance is provided and then the customer only pays for the times when the increased performance is used.)

If the offer is not accepted as determined at step 622, then the performance threshold is reset at step 622 and the integrated circuit performance monitor module 332 continues to monitor performance at step 610. The user can also optionally indicate a desire to no longer monitor performance when the offer is declined.

If the offer is accepted as determined at step 622, then the integrated circuit performance monitor module 332 initiates a process for obtaining consideration for increasing the performance of the integrated circuit at step 630.

Once consideration has been obtained, then the performance increase operation is performed at step 632. Based upon the customer decision and consideration, the performance increase may be to the maximum possible performance increase available to the integrated circuit or some portion less than the maximum possible performance increase. If there is additional available performance increase possible as determined at step 640, then the threshold is reset at step 624 and the integrated circuit performance monitor module 332 continues to monitor performance at step 610. If there is no remaining performance increase available, then the operation of the integrated circuit performance monitor module 332 completes.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, the above-discussed embodiments include modules that perform certain tasks. The modules discussed herein may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A configurable performance module for use in an integrated circuit comprising:
   a performance control circuit, the performance control circuit controlling a performance level of the integrated circuit, the performance control circuit enabling changing the performance level of the integrated circuit from a first performance level to a second performance level after manufacturing of the integrated circuit is complete; and,
   a performance lock circuit coupled to the performance control circuit, the performance lock circuit determining whether to enable changing the performance level of the integrated circuit from the first performance level to the second performance level; and wherein
   the integrated circuit is determined to be capable of functioning at the second performance level based upon a higher than expected anticipated performance yield when fabricating the integrated circuit.

2. The configurable performance module of claim 1 further comprising:
   a security circuit coupled to the performance lock circuit, the security circuit ensuring that the performance lock circuit only enable changes to the performance level when certain security conditions are met.

3. The configurable performance module of claim 1 wherein:
   the first performance level of the integrated circuit is based upon market demand.

4. The configurable performance module of claim 1 wherein:
   the performance lock circuit enables the performance control circuit to change the performance level when receiving a performance indication.

5. The configurable performance module of claim 1 wherein:
   the integrated circuit is sold at a predefined price based upon the first performance level.

6. The configurable performance module of claim 5 wherein:
   the integrated circuit is fabricated to operate at the second performance level.

7. A processor comprising:
   a processor core;
   a configurable performance module coupled to the processor core, the configurable performance module including a performance control circuit, the performance control circuit controlling a performance level of the processor, the performance control circuit enabling changing the performance level of the processor from a first performance level to a second performance level after manufacturing of the processor is complete; and, a performance lock circuit coupled to the performance control circuit, the performance lock circuit determining whether to enable changing the performance level of the processor from the first performance level to the second performance level; and wherein, the processor is determined to be capable of functioning at the second performance level based upon a higher than expected anticipated performance yield when fabricating the integrated circuit.

8. The processor of claim 7 wherein the configurable performance module further includes:

a security circuit coupled to the performance lock circuit, the security circuit ensuring that the performance lock circuit only enable changes to the performance level when certain security conditions are met.

9. The processor of claim 7 wherein:
the first performance level is based upon market demand.

10. The processor of claim 7 wherein:
the performance lock circuit enables the performance control circuit to change the performance level when receiving a performance indication.

11. The processor of claim 7 wherein:
the processor is sold at a predefined price based upon the first performance level.

12. The processor of claim 7 wherein:
the processor is fabricated to operate at the second performance level.

* * * * *